(12) United States Patent
Yuan et al.

(10) Patent No.: US 11,309,521 B2
(45) Date of Patent: Apr. 19, 2022

(54) FLEXIBLE DISPLAY MODULE HAVING A HOLLOW DEFINED MIDDLE

(71) Applicant: Kunshan New Flat Panel Display Technology Center Co., Ltd., Kunshan (CN)

(72) Inventors: Bo Yuan, Kunshan (CN); Li Lin, Kunshan (CN); Lin Xu, Kunshan (CN); Genmao Huang, Kunshan (CN); Kun Hu, Kunshan (CN); Hao Feng, Kunshan (CN)

(73) Assignee: Kunshan New Flat Panel Display Technology Center Co., Ltd., Kunshan (CN)

( * ) Notice: Subject to any disclaimer, the term of this patent is extended or adjusted under 35 U.S.C. 154(b) by 0 days.

(21) Appl. No.: 16/659,966

(22) Filed: Oct. 22, 2019

(65) Prior Publication Data

US 2020/0052246 A1    Feb. 13, 2020

Related U.S. Application Data (63) Continuation of application No. PCT/CN2018/090442, filed on Jun. 8, 2018.

(30) Foreign Application Priority Data

Oct. 31, 2017    (CN) .......................... 201711045910.1

(51) Int. Cl.
*H01L 51/00* (2006.01)
*H01L 51/52* (2006.01)
(Continued)

(52) U.S. Cl.
CPC ........ *H01L 51/5253* (2013.01); *H01L 27/323* (2013.01); *H01L 27/3232* (2013.01);
(Continued)

(58) Field of Classification Search
CPC ............. H01L 51/5253; H01L 51/0097; H01L 27/323; H01L 27/3232; H01L 27/3244
See application file for complete search history.

(56) References Cited

U.S. PATENT DOCUMENTS 5,880,795 A * 3/1999 Nagata .............. G02F 1/133308
349/58
6,376,769 B1 * 4/2002 Chung ...................... B32B 7/12
174/524
(Continued)

FOREIGN PATENT DOCUMENTS

CN      102690044 A     9/2012
CN      102693683 A     9/2012
(Continued)

OTHER PUBLICATIONS

PCT Written opinion dated Sep. 13, 2018 in International Application No. PCT/CN2018/090442.
(Continued)

*Primary Examiner* — Ida M Soward
(74) *Attorney, Agent, or Firm* — Rimon PC (57) ABSTRACT

A flexible display module and a manufacturing method thereof are disclosed. The flexible display module includes a first flexible material layer and a second flexible material layer stacked on the first flexible layer, a sealing layer disposed between the first flexible material layer and the second flexible material layer, and a module layer disposed in the hollow of the sealing layer. The sealing layer has a hollow defined in a middle of the sealing layer. The area of the bottom area of the hollow is larger than the area of the module layer.

20 Claims, 8 Drawing Sheets

(51) Int. Cl.
*H01L 27/32* (2006.01)
*G02F 1/1333* (2006.01)

(52) U.S. Cl.
CPC ...... *H01L 27/3244* (2013.01); *H01L 51/0097* (2013.01); *G02F 1/133305* (2013.01); *H01L 2251/5338* (2013.01)

(56) References Cited

U.S. PATENT DOCUMENTS

| | | | | |
|---|---|---|---|---|
| 6,512,512 B1* | 1/2003 | Blanchard | ............... | G06F 3/045 |
| | | | | 345/173 |
| 6,856,086 B2* | 2/2005 | Grace | ............... | H01L 27/3281 |
| | | | | 313/498 |
| 6,977,710 B2* | 12/2005 | Akiyama | .......... | G02F 1/133305 |
| | | | | 349/158 |
| 7,327,426 B1* | 2/2008 | Suginoya | ............ | G02F 1/13378 |
| | | | | 349/130 |
| 7,368,307 B2* | 5/2008 | Cok | ............... | H01L 51/525 |
| | | | | 438/26 |
| 7,826,124 B2* | 11/2010 | Xu | ............... | C08G 61/126 |
| | | | | 359/273 |
| 8,144,272 B2* | 3/2012 | Isobe | ............... | G02F 1/133 |
| | | | | 349/12 |
| 8,395,319 B2* | 3/2013 | Tchakarov | ............ | B32B 17/06 |
| | | | | 313/512 |
| 8,568,184 B2* | 10/2013 | Prest | ............... | H01L 51/5246 |
| | | | | 445/25 |
| 8,598,787 B2* | 12/2013 | Bouten | ............ | G02F 1/133305 |
| | | | | 313/506 |
| 8,619,003 B2* | 12/2013 | Dairiki | ............... | H01Q 13/10 |
| | | | | 343/893 |
| 8,829,634 B2* | 9/2014 | Bonekamp | ......... | H01L 31/02013 |
| | | | | 257/433 |
| 8,926,389 B2* | 1/2015 | Nishido | ............... | H01L 51/524 |
| | | | | 445/25 |
| 9,023,672 B2* | 5/2015 | Hodrinsky | ............ | H01L 33/54 |
| | | | | 438/28 |
| 9,406,698 B2* | 8/2016 | Yamazaki | .............. | G02F 1/1339 |
| 9,590,019 B2* | 3/2017 | Kim | ............... | H01L 27/326 |
| 9,847,505 B2* | 12/2017 | Chida | ............... | H01L 51/56 |
| 9,950,505 B2* | 4/2018 | Qiao | ............... | H01L 51/5246 |
| 10,170,726 B2* | 1/2019 | Yamazaki | ........... | H01L 51/5246 |
| 10,492,311 B2* | 11/2019 | Liu | ............... | H05K 5/0017 |
| 10,579,165 B2* | 3/2020 | He | ............... | B32B 17/06 |
| 10,763,314 B2* | 9/2020 | Everaerts | ............... | H01L 27/323 |
| 2003/0087292 A1* | 5/2003 | Chen | ............... | B01F 11/0051 |
| | | | | 435/6.12 |
| 2003/0207488 A1* | 11/2003 | Carcia | ............... | H01L 51/0097 |
| | | | | 438/82 |
| 2004/0161530 A1* | 8/2004 | Stark | ............... | H01L 27/14618 |
| | | | | 427/58 |
| 2007/0272015 A1* | 11/2007 | Kazama | ............ | G01C 19/5712 |
| | | | | 73/504.08 |
| 2009/0169806 A1* | 7/2009 | Lo | ............... | G02B 26/005 |
| | | | | 428/119 |
| 2010/0066519 A1* | 3/2010 | Baur | ............... | B32B 17/1022 |
| | | | | 340/435 |
| 2010/0099323 A1* | 4/2010 | Zu | ............... | H01L 51/5246 |
| | | | | 445/25 |
| 2010/0107770 A1* | 5/2010 | Serban | ............... | G01L 1/142 |
| | | | | 73/718 |
| 2010/0134459 A1 | 6/2010 | Kawada | | |
| 2010/0155247 A1* | 6/2010 | Cao | ............... | C08L 23/22 |
| | | | | 204/600 |
| 2011/0080372 A1* | 4/2011 | Lee | ............... | G06F 3/045 |
| | | | | 345/174 |
| 2012/0297885 A1* | 11/2012 | Hou | ............... | G01L 1/18 |
| | | | | 73/718 |
| 2012/0320444 A1* | 12/2012 | Baur | ............... | B32B 17/10798 |
| | | | | 359/267 |
| 2014/0092356 A1* | 4/2014 | Ahn | ............... | G02F 1/1339 |
| | | | | 349/153 |
| 2015/0069449 A1* | 3/2015 | Nishido | ............... | H01L 51/5246 |
| | | | | 257/98 |
| 2015/0123106 A1* | 5/2015 | Yasumoto | ............ | H01L 51/003 |
| | | | | 257/40 |
| 2016/0218320 A1* | 7/2016 | Chen | ............... | H01L 51/5246 |
| 2016/0313834 A1* | 10/2016 | Ma | ............... | H01L 27/323 |
| 2017/0139532 A1* | 5/2017 | Franklin | ............... | G06F 1/163 |
| 2020/0243805 A1* | 7/2020 | Kishimoto | ............ | H01L 51/56 |

FOREIGN PATENT DOCUMENTS

| | | |
|---|---|---|
| CN | 103346163 A | 10/2013 |
| CN | 103928490 A | 7/2014 |
| CN | 103985315 A | 8/2014 |
| CN | 104576964 A | 4/2015 |
| CN | 204808776 U | 11/2015 |
| CN | 105513497 A | 4/2016 |
| CN | 205177319 U | 4/2016 |
| CN | 105975135 A | 9/2016 |
| CN | 106023810 A | 10/2016 |
| CN | 106030687 A | 10/2016 |
| CN | 106784382 A | 5/2017 |
| JP | 2006024530 A | 1/2006 |
| TW | I602337 B | 10/2017 |
| WO | 2017159503 A1 | 9/2017 |

OTHER PUBLICATIONS

Taiwan First Office Action for Application No. 107122758 dated Apr. 11, 2019.
Chinese First Office Action for CN Application No. 201711045910.1 dated Aug. 13, 2019.
Chinese Second Office Action for CN Application No. 201711045910.1 dated Sep. 25, 2019.
PCT International Search Report dated Sep. 13, 2018 in International Application No. PCT/CN2018/090442.

* cited by examiner

FLEXIBLE DISPLAY MODULE HAVING A HOLLOW DEFINED MIDDLE

CROSS-REFERENCE TO RELATED APPLICATIONS

This application is a continuation application of International Application No. PCT/CN2018/090442 filed on Jun. 8, 2018, which claims priority to Chinese patent application No. 201711045910.1 filed on Oct. 31, 2017. Both applications are incorporated herein by reference in their entireties.

TECHNICAL FIELD

The present invention relates to the technical field of flexible display, and in particular to a flexible display module and a manufacturing method thereof.

BACKGROUND

With the continuous development of display technology, mobile phone screens are developing towards high resolution, narrow bezel and large screen area. When the mobile phone screens become increasingly large, mobile phones become less portable. Although some existing flexible display modules (e.g., flexible display panels displaying by AMOLEDs (Active Matrix Organic Light Emitting Diodes)) can realize flexible display states in different forms such as folded, curled or twisted, there is a conflict between the stiffness (press tactility, which can be interpreted as hardness and can be generally satisfied by increasing the thickness of the cover plate) of the flexible screen and the splitting of film layers when it is folded. If a screen is expected to have better stiffness, the bending radius will increase and the thickness of the manufactured mobile phone will increase. If the stiffness is reduced, the user's touch experience will degrade.

SUMMARY

In view of the above, embodiments of the present invention provide a flexible display module and a manufacturing method thereof, which solve the conflict between the stiffness and the prevention of splitting of film layers in existing flexible display modules.

An embodiment of the present invention provides a flexible display module, including:

a first flexible material layer and a second flexible material layer stacked on the first flexible layer;

a sealing layer disposed between the first flexible material layer and the second flexible material layer, the sealing layer having a hollow defined in a middle of the sealing layer;

a module layer disposed in the hollow of the sealing layer, and an area of a bottom area of the hollow is larger than an area of the module layer.

In an embodiment of the present invention, the first flexible material layer and/or the second flexible material layer is a flexible glass layer.

In an embodiment of the present invention, the flexible display module further includes:

a first silicone oil layer disposed between the module layer and the first flexible material layer; and/or a second silicone oil layer disposed between the module layer and the second flexible material layer.

In an embodiment of the present invention, the module layer is a display panel including a bonding end for establishing an electrical connection with an external circuit structure;

the sealing layer includes a rim portion and an open frame portion, the open frame portion and the rim portion are combined to form a frame shape, the rim portion is pressed onto a surface of the bonding end of the module layer, and bonding pins of the bonding end are exposed.

In an embodiment of the present invention, the module layer includes a fixed region fixed to the first flexible material layer and/or the second flexible material layer, and a sliding region slidable relative to the first flexible material layer and the second flexible material layer in the hollow, the fixed region extending from the bonding end.

In an embodiment of the present invention, the sealing layer includes at least one gas vent and a sealing material for sealing the gas vent.

In an embodiment of the present invention, the sealing layer includes a plurality of the gas vents, and the plurality of the gas vents are formed in a predetermined bending region of the flexible display module and/or in an extension region of a gap between the module layer and the hollow, respectively.

In an embodiment of the present invention, the sealing layer is adhered to the first flexible material layer and/or the second flexible material layer by an adhesive layer.

In an embodiment of the present invention, the sealing layer is made of silicone rubber.

In an embodiment of the present invention, the module layer includes a substrate, a thin film transistor device layer, an organic light emitting diode device layer, a touch screen and a polarizer which are stacked in sequence;

or, the module layer is one or a combination of the substrate, the thin film transistor device layer, the organic light emitting diode device layer, the touch screen and the polarizer;

or, the module layer incudes a polarization layer, a touch layer and a display functional layer which are stacked, and the touch layer includes a third flexible glass layer and a conductive material layer coated onto one side of the third flexible glass layer, and the conductive material layer is disposed between the third flexible glass layer and the display functional layer;

or, the module layer includes the polarization layer, an ultra-thin glass layer, an indium tin oxide layer, a pressure-sensitive adhesive layer and the organic light emitting diode device layer which are stacked, only the indium tin oxide layer and the pressure-sensitive adhesive layer having moisture and oxygen blocking adhesive layers disposed on peripheries of the indium tin oxide layer and the pressure-sensitive adhesive layer;

or, the module layer includes the thin film transistor device layer, an anode layer, an organic light emitting layer and a cathode layer which are disposed successively.

An embodiment of the present invention provides a flexible display module, including: a first flexible material layer including a groove; a module layer disposed in the groove of the first flexible material layer; and, a second flexible material layer disposed on the module layer.

In an embodiment of the present invention, the module layer is adhered within the groove of the first flexible material layer by an optical adhesive or attached by silicone oil.

In an embodiment of the present invention, a cross-sectional area of the groove is larger than a cross-sectional area of the module layer.

In an embodiment of the present invention, a periphery of the second flexible material layer and a side of the groove of the first flexible material layer are encapsulated by a laser-sintering glass frit process.

In an embodiment of the present invention, the second flexible material layer is adhered onto the module layer by an optical adhesive.

In an embodiment of the present invention, the first flexible material layer includes a first surface and a second surface which are opposite to each other, the module layer is disposed on the first surface, a wiring region is disposed on the second surface, and the wiring region is electrically connected to the module layer.

In an embodiment of the present invention, the first flexible material layer includes vias, and circuit wires in the wiring region are connected to the module layer through the vias in the first flexible material layer.

In an embodiment of the present invention, the flexible display module further includes: at least one strain blocking layer disposed between the first flexible material layer and the second flexible material layer, and the strain blocking layer includes a chamber and an elastic material layer surrounding the periphery of the chamber.

In an embodiment of the present invention, a gas or a liquid is filled in the chamber; or the chamber is in vacuum.

In an embodiment of the present invention, the gas is one or a mixture of more of air and inert gases.

An embodiment of the present invention provides a display device, including a frame having a predetermined curved shape and any flexible display module described above, the flexible display module is installed into the frame, and a perimeter of the frame is less than a perimeter of the flexible display module.

In an embodiment of the present invention, the frame is attached by attaching the border of the frame onto the periphery of the entire flexible display module.

In an embodiment of the present invention, an annular groove is formed on an inner surface of the frame.

In an embodiment of the present invention, the annular groove has a depth of 3-5 mm.

An embodiment of the present invention provides a method for manufacturing a flexible display module, including:

manufacturing a sealing layer on a surface of a first flexible material layer, the sealing layer having a hollow defined in a middle of the sealing layer, and an area of a bottom area of the hollow being larger than an area of the module layer;

attaching the module layer within the hollow; and attaching a second flexible material layer to a surface of the sealing layer.

In an embodiment of the present invention, before the attaching the module layer within the hollow, the method further includes: coating a first silicone oil layer on a bottom surface of the hollow;

and/or, before the attaching a second flexible material layer to a surface of the sealing layer, the method further includes:

coating a second silicone layer on a surface of the module layer.

In an embodiment of the present invention, the module layer is a display panel including a bonding end for establishing an electrical connection with an external circuit structure;

the manufacturing a sealing layer on a surface of a first flexible material layer includes: manufacturing, on a surface of the first flexible material layer, an open frame portion of the sealing layer;

the attaching the module layer within the hollow includes: attaching the module layer within an open region of the open frame portion, and making the bonding end of the module layer extending out from the open region of the open frame portion;

before the attaching a second flexible material layer to a surface of the sealing layer, the method further includes: pressing a rim portion of the sealing layer onto a surface of the bonding end of the module layer and exposing bonding pins of the bonding end; and the open frame portion and the rim portion are combined to form a frame shape.

In an embodiment of the present invention, the module layer includes a fixed region where the module layer is fixed to the first flexible material layer and/or the second flexible material layer, and the fixed region extends from the bonding end;

the method further includes:

fixing the module layer to the first flexible material layer and/or the second flexible material layer by an adhesive material in the fixed region.

In an embodiment of the present invention, the manufacturing, on a surface of the first flexible material layer, an open frame portion of the sealing layer includes:

manufacturing a sealing material layer on the surface of the first flexible material layer; and forming the open frame portion by cutting the sealing material layer by laser etching.

In an embodiment of the present invention, the sealing layer is adhered to the first flexible material layer and/or the second flexible material layer by an adhesive layer.

In an embodiment of the present invention, the sealing layer includes at least one gas vent;

and the attaching a second flexible material layer to a surface of the sealing layer includes:

attaching the second flexible material layer to the surface of the sealing layer along a direction at which the at least one gas vent extends outwardly; and sealing the at least one gas vent by a sealing material.

In the flexible display module and the manufacturing method thereof provided in the embodiments of the present invention, the module layer is disposed in the hollow between the first flexible material layer and the second flexible material layer, and the area of the bottom area of the hollow is larger than the area of the module layer. In this way, when the flexible module layer is bent, the module layer can slide in the hollow relative to the first flexible material layer and the second flexible material layer, so that the bending stress is relieved. Accordingly, the splitting of the film layers in the module layer can be effectively prevented, the bending resistance of the flexible display modules is further improved, and the reliability of product is improved.

DETAILED DESCRIPTION

To make the objectives, technical means and advantages of the present invention clearer, the present invention will be further described below in details with reference to the accompanying drawings. Apparently, the embodiments described herein are some but not all of the embodiments of the present invention. All other embodiments obtained by a person of ordinary skill in the art on the basis of the embodiments in the present invention without paying any creative effort shall fall into the protection scope of the present invention.

Figure 1:
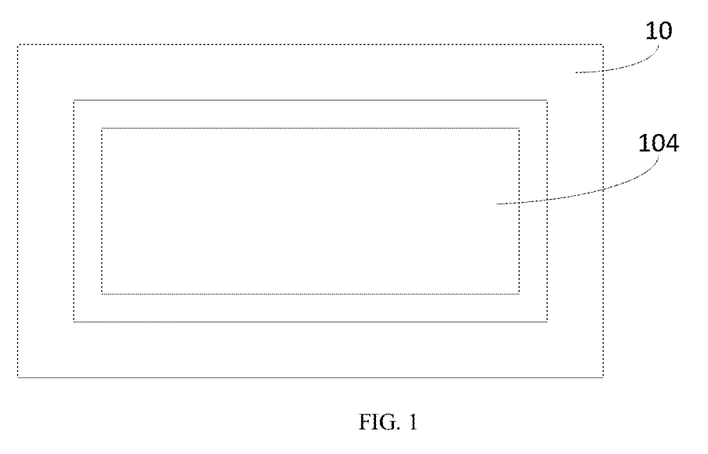
FIG. 1 is a schematic structure diagram of a flexible display module according to an embodiment of the present invention.

FIG. 1 is a schematic structure diagram of a flexible display module according to an embodiment of the present invention.

The flexible display module includes a flexible material layer 10, and a module layer 104 disposed inside the flexible material layer 10.

The module layer 104 is a layer made of module materials in the flexible display module, and may include one or more functional layers. In the embodiment of the present invention shown in FIG. 1, the module layer 104 may be a display panel having a display function in the flexible display module, and according to different display principles, the display panel may involve multiple types, such as Organic Light Emitting Diode (OLED), Electrophoretic Display (EPD), Liquid Crystal Display (LCD), Thin Film Transistor (TFT) and so on. In an embodiment of the present invention, the structure of the module layer 104 includes: a substrate, a thin film transistor device layer, an organic light emitting diode device layer, a touch screen, a polarizer and the like, which are stacked in sequence. The module layer 104 may also be one or a combination of the following functional layers in the display panel: the substrate, the thin film transistor device layer, the organic light emitting diode device layer, the touch screen and the polarizer. The specific structure of the module layer 104 is not limited in the present invention.

By encapsulating the module layer 104 inside the flexible glass layer 10, even if a thin film encapsulation layer that is easy to fracture during bending is removed from an existing display panel structure, the encapsulation performance can still be satisfied, and erosion to display devices in the module layer 104 by external moisture and oxygen can be prevented as well.

In an embodiment of the present invention, the flexible material layer 10 may be a flexible glass layer. The flexible glass is bendable. It has been proven by tests that the flexible glass layer can withstand the bending fatigue test with a bending frequency of 100,000 times and a bending radius of 5 mm. When a piece of glass is thin to a certain extent, flexibility of the glass is manifested, and it can be bent without fracturing. The ultra-thin flexible glass has glass properties, such as hardness, transparency, heat resistance, electrical insulation, air impermeability, and relatively stable mechanical and chemical properties in oxidation and illumination environments, and is also bendable and light in weight. In an embodiment of the present invention, thickness of the flexible glass substrate 4 may be in a range from 25 μm to 100 μm. Specific thickness and material of a first flexible material layer 101 and a second flexible material layer 102 are not limited in the embodiments of the present invention.

Since excellent bending resistance of the flexible glass can meet bending requirements of the flexible display module, the problem that the module layer 104 of the flexible display module is easy to fracture during bending is effectively solved. In addition, it enables the flexible material layer 10 to disperse the stress applied on the module layer 104 during bending, and further avoid the fracture failure of the module layer 104 during bending.

Figure 2:
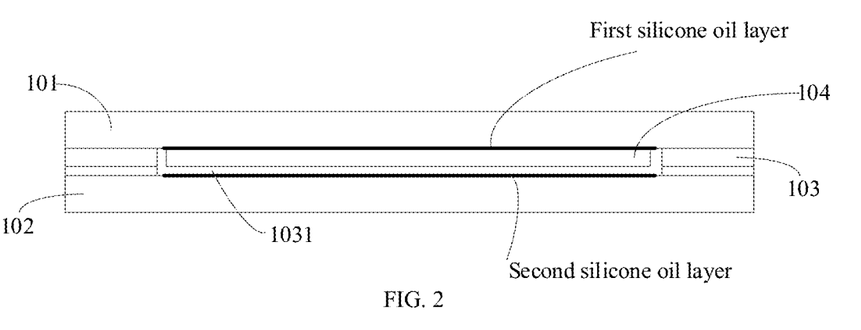
FIG. 2 is a schematic structure diagram illustrating the flexible material layer in FIG. 1 including a first flexible material layer, a second flexible material layer, and a sealing layer.

FIG. 2 is a schematic structure diagram illustrating the flexible material layer in FIG. 1 including a first flexible material layer, a second flexible material layer, and a sealing layer. As shown in FIG. 2, the flexible display module includes the first flexible material layer 101, the second flexible material 102 stacked on the first flexible layer, the sealing layer 103 disposed between the first flexible material layer 101 and the second flexible material layer 102, and a module layer 104. The sealing layer 103 has a hollow 1031 defined in a middle of the sealing layer 103, and the module layer 104 is disposed in the hollow 1031 of the sealing layer 103. An area of a bottom area of the hollow 1031 is larger than an area of the module layer 104. In the embodiment of the present invention shown in FIG. 2, the first flexible material layer 101 and/or the second flexible material layer 102 may be a flexible glass layer. By replacing a substrate and/or a cover plate in the existing flexible display module with the flexible glass layer, the conflict between the stiffness and the prevention of splitting of film layers in the existing flexible display module can be effectively solved due to the excellent stiffness and bending resistance of the flexible glass.

Meanwhile, the module layer 104 is disposed in the hollow 1031 which is defined between the first flexible material layer 101 and the second flexible material layer 102, and the area of the bottom area of the hollow 1031 is larger than the area of the module layer 104, so the module layer 104 can slide in the hollow 1031 relative to the first flexible material layer 101 and the second flexible material layer 102 when the flexible module 104 is bent, thereby relieving the bending stress, effectively avoiding the splitting of film layers in the module layer 104, further improving the bending resistance of the flexible display module, and improving reliability of the products.

It should be understood that specific shape of the hollow 1031 in the sealing layer 103 may be determined according to shape of the module layer 4. Generally, the hollow 1031 is only slightly larger than the module layer 104 in area and has the same shape as the module layer 104. For example, when the module layer 104 has a rectangular shape, the hollow 1031 in the sealing layer 103 may also have a rectangular shape, the area of the bottom area of the hollow 1031 need to be larger than the area of the module layer 104, so that the module layer 104 can slide in the hollow 1031 during bending. The specific shape of the hollow 1031 in the sealing layer 103 is not limited in the present invention.

In an embodiment of the present invention, in order to make the module layer 104 slide in the hollow 1031 more flexibly and smoothly during bending, a first silicone oil layer may be disposed between the module layer 104 and the first flexible material layer 101, and/or a second silicone oil layer may be disposed between the module layer 104 and the second flexible material layer 102. Even without the first silicone oil layer and the second silicone oil layer, the module layer 104 can also slide in the hollow 1031. Whether the flexible display module includes the first silicone oil layer and the second silicone oil layer is not limited in the present invention.

In an embodiment of the present invention, the sealing layer 103 is fixed to the first flexible material layer 101 and/or the second flexible material 102 by an adhesive layer. The material of the adhesive layer may be an optically clear adhesive (OCA). The specific material of the adhesive layer is not limited in the present invention.

In an embodiment of the present invention, the sealing layer 103 may be made of silicone rubber. The silicone rubber material can elastically deform as the bending stress changes, so the sealing layer 103 has good bending resistance and sealing performance. It should be understood that the sealing layer 103 may also be made of other sealing materials, and the specific material of the sealing layer 103 is not limited in the present invention.

Figure 3:
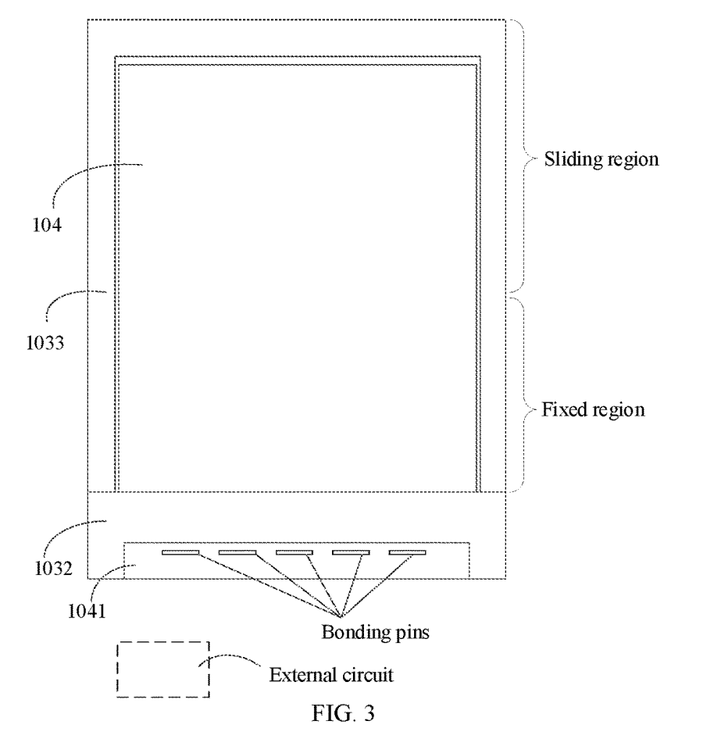
FIG. 3 is a schematic structure diagram illustrating the module layer in FIG. 2 including a bonding end and the sealing layer including a rim portion and an open frame portion.

FIG. 3 is a schematic structure diagram illustrating the module layer in FIG. 2 including a bonding end and the sealing layer including a rim portion and an open frame portion. As shown in FIG. 3, the module layer 104 of the flexible display module includes the bonding end 1041 for making an electrical connection with an external circuit structure. In this case, considering that, during the manufacture of the flexible display module, the sealing layer 103 in an integral frame shape may not meet the requirement that the module layer 104 is electrically connected with an external structure via the bonding end 1041, the sealing layer 103 may be designed to include the rim portion 1032 and the open frame portion 1033 separated from each other. The open frame portion 1033 and the rim portion 1032 are combined to form a frame shape. In this way, during the manufacture of the sealing layer 103, the open frame portion 1033 is manufactured first; and then, after the module layer 104 is attached in an open region of the open frame portion 1033, the rim portion 1032 is pressed onto a surface of the bonding end 1041 of the module layer 104, exposing bonding pins of the bonding end 1041.

In an embodiment of the present invention, the module layer 104 may include a fixed region fixed to the first flexible material layer 101 and/or the second flexible material layer 102, and a sliding region slidable relative to the first flexible material layer 101 and the second flexible material layer 102 in the hollow 1031. The fixed region extends from the bonding end 1041. For example, when the sealing layer 103 includes the separated rim portion 1032 and the open frame portion 1033, the rim portion 1032 can press the bonding end 1041 of the module layer 104 to fix to the first flexible material layer 101. The bonding end 1041 of the module layer 104 can remain in a fixed state relative to the first flexible material layer 101, while the sliding region of the module layer 104 remains slidable relative to the first flexible material layer 101 and the second flexible material layer 102. When the flexible display module is bent, the fixed region in the fixed state can remain being fixed, and the sliding region in the sliding state can relieve the bending stress by sliding, thereby avoiding the splitting of film layers inside the module layer 104.

In a further embodiment of the present invention, when the module layer 104 includes the above-mentioned fixed region and the sliding region, the flexible display module may include a predetermined bending region. Since the fixed region of the module layer 104 is a region in which the module layer 104 fixed to the first flexible material layer 101 and/or the second flexible material layer 102, in order to avoid the concentration of the bending stress during bending, the predetermined bending region should be formed in the sliding region of the module layer 104.

In the embodiment shown in FIG. 3, the fixed region extends from the bonding end 1041 and extends to one-half of the area of the module layer 104, the specific area of the fixed region is not strictly limited in the present invention, as long as a region in the sliding state can relieve the bending stress by sliding. The specific area, location and shape of the fixed region may be determined according to actual scenario requirements.

Figure 4:
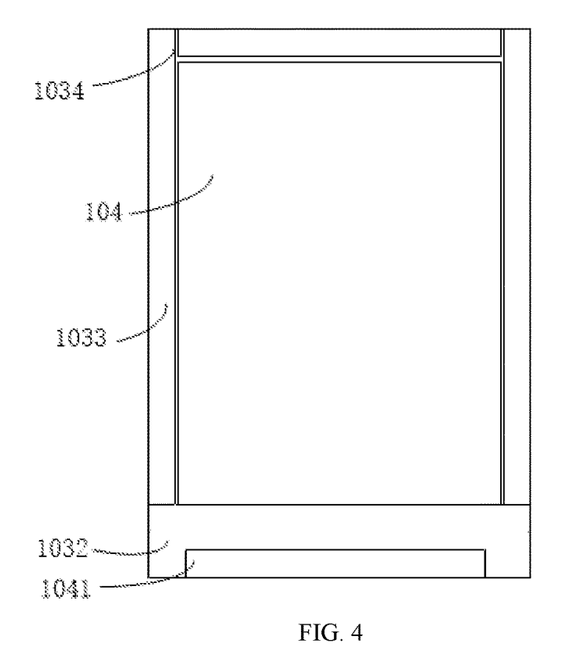
FIG. 4 is a schematic structure diagram illustrating the sealing layer in FIG. 3 including a gas vent.

FIG. 4 is a schematic structure diagram illustrating the sealing layer in FIG. 3 including a gas vent. As shown in FIG. 4, the sealing layer 103 of the flexible display module includes at least one gas vent 1034 and a sealing material for sealing the gas vent 1034. These gas vents 1034 can discharge bubbles generated during the process of attaching the second flexible material layer 102 to the surface of the sealing layer 103, preventing these bubbles from staying between the second flexible material layer 102 and the module layer 104. After the process of attaching the second flexible material layer 102 to the surface of the sealing layer 103, the at least one gas vent 1034 is sealed by the sealing material.

Figure 5:
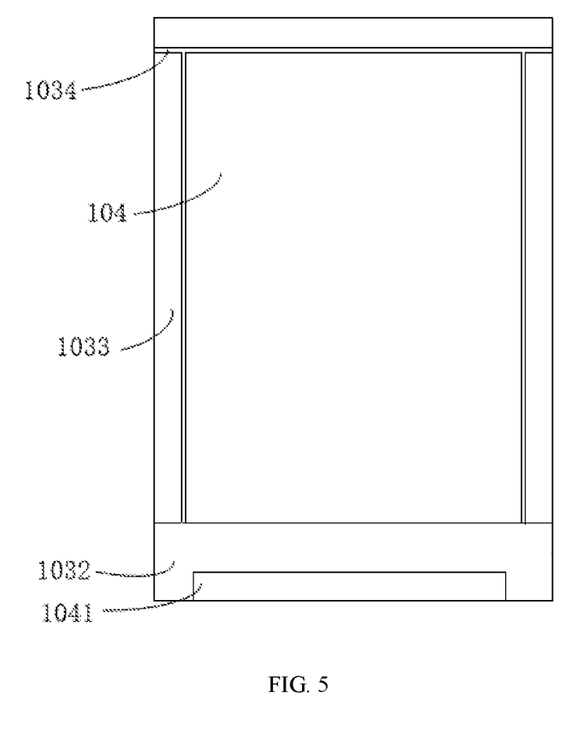
FIG. 5 is another schematic structure diagram illustrating the sealing layer in FIG. 3 including a gas vent.
Figure 6:
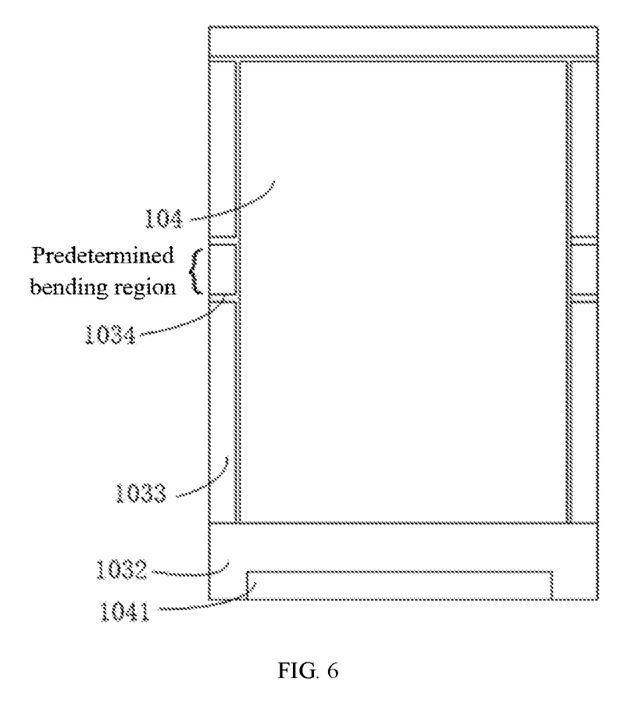
FIG. 6 is a schematic structure diagram illustrating the sealing layer in FIG. 5 including a gas vent disposed in a predetermined bending region.

In an embodiment of the present invention, the sealing layer 103 may include a plurality of gas vents 1034. The plurality of the gas vents 1034 may be respectively formed in the predetermined bending region of the flexible display module and/or in an extension region of a gap between the module layer 104 and the hollow 1031 as shown in FIG. 2. The extension region of the gap between the module layer 104 and the hollow 1031 may be a region positioned at an imagined line along which the gap between the module layer 104 and the hollow 1031 extends. For example, when the module layer 104 is rectangular, the gas vents 1034 may be formed in an extension region of a longitudinal gap between the module layer 104 and the hollow 1031 (as shown in FIG. 4) and an extension region of a transverse gap between the module layer 104 and the hollow 1031. The gas vents 1034 mainly function to prevent bubbles from staying in the predetermined bending region (as shown in FIG. 6) or after the process of attaching the second flexible material layer 102 to the surface of the sealing layer 103 (as shown in FIG. 5). In this way, the second flexible material layer 102 can be attached to the surface of the sealing layer 103 along a direction at which the gas vents 1034 extend outwardly, so that bubbles generated during the process of attaching the second flexible material layer 102 to the surface of the sealing layer 103 are discharged. The specific disposed location of these gas vents 1034 may be determined according to actual scenario requirements, and the specific disposed location, location combination and number of the gas vents 1034 are not strictly limited in the present invention.

Figure 7:
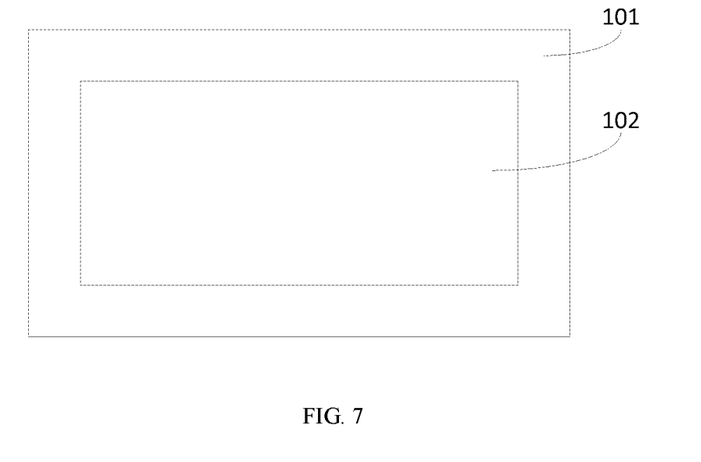
FIG. 7 is a schematic structure diagram illustrating the flexible material layer in FIG. 1 including a first flexible material layer and a second flexible material layer.
Figure 8:
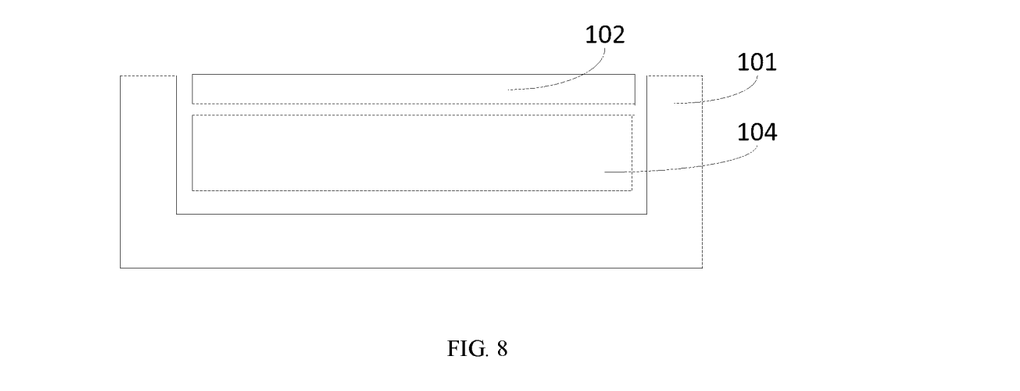
FIG. 8 is a schematic structure diagram illustrating a front view of FIG. 7.

FIG. 7 is a schematic structure diagram illustrating the flexible material layer in FIG. 1 including a first flexible material layer and a second flexible material layer, and FIG. 8 is a schematic structure diagram illustrating a front view of FIG. 7.

As shown in FIGS. 7 and 8, the flexible display module includes a flexible glass layer 10 and a module layer 104 disposed inside the flexible glass layer 10.

The flexible glass layer 10 includes a flexible material layer 101 having a groove defined in the middle of the flexible material layer 101 and a second flexible material layer 102. The first flexible material layer 101 has a groove defined in the middle of the first flexible material layer 101 may be manufactured by grooving in the middle of a piece of a flexible glass by etching or other methods.

The groove may be formed by etching or other methods.

The module layer 104 is disposed in the groove of the first flexible material layer 101. The module layer 104 may be disposed in the groove of the flexible material layer 101 by an optical adhesive. Due to the presence of the groove of the first flexible material layer 101, the sliding range of the second flexible material layer 102 is effectively limited, and the overall failure of the flexible display module due to the excessive location derivation of the second flexible material layer 102 during bending is prevented.

The second flexible material layer 102 is disposed on the module layer 104, and the second flexible material layer 102 is adhered onto the module layer 104 by an optical adhesive. The upper surface of the second flexible material layer 102 should be flush with the upper surface of the first flexible material layer 101. In the fifth embodiment of the present invention, a cross-sectional area of the groove in the middle of the first flexible material layer 101 is larger than a cross-sectional area of the module layer 104. In this way, during the bending of the flexible display module, the module layer 104 can slide in the groove and thus can further disperse the bending stress, avoiding the fracture of the module layer 104. Meanwhile, the second flexible material layer 102 should be located in the groove of the first flexible material layer 101. Due to the presence of the first flexible material layer 101, the sliding of the second flexible material layer 102 is effectively restrained, and the bending resistance of the flexible display module is improved.

The module layer 104 may be attached in the groove of the first flexible material layer 101 by optical adhesive, silicone oil or the like. When the module layer 104 is attached by silicone oil, the module layer 104 can better slide in the groove to relieve the bending stress. The specific disposition mode and the bonding material used is not limited in the present invention.

Figure 9:
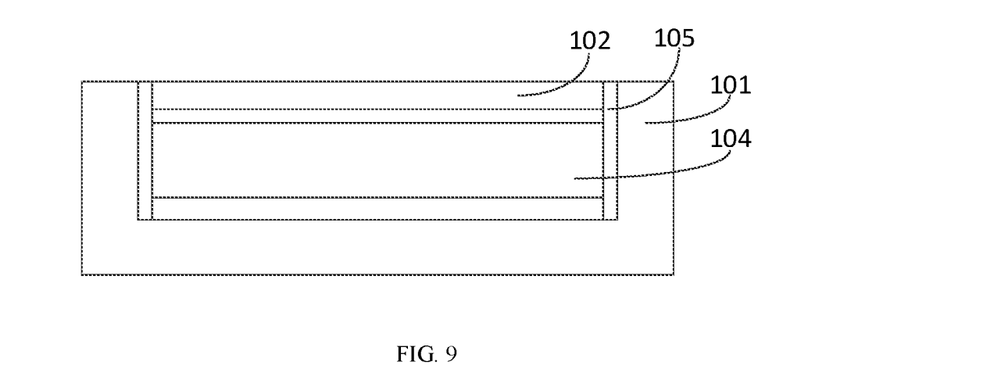
FIG. 9 is a schematic structure diagram illustrating the flexible display module in FIG. 8 including a glass frit layer.

FIG. 9 is a schematic structure diagram illustrating the flexible display module in FIG. 8 including a glass frit layer.

In an embodiment of the present invention, a periphery of the second flexible material layer 102 and a side of the groove of the first flexible material layer 101 are encapsulated by a laser-sintering glass frit process. The encapsulated glass frit layer 105 is shown in FIG. 9. The laser-sintered glass frit layer 105 fills a gap between the periphery of the second flexible material layer 102 and the side of the groove of the first flexible material layer 101, so that external moisture and oxygen are prevented from entering into the module layer 104. After encapsulation, the upper surface of the module layer 104 is covered with the second flexible material layer 102, the lower surface and sides thereof are covered with the first flexible material layer 101 for protection, and the periphery thereof is protected by the glass frit layer 105, thereby effectively blocking the moisture and oxygen, and improving the moisture and oxygen blocking performance of the flexible display module.

Figure 10:
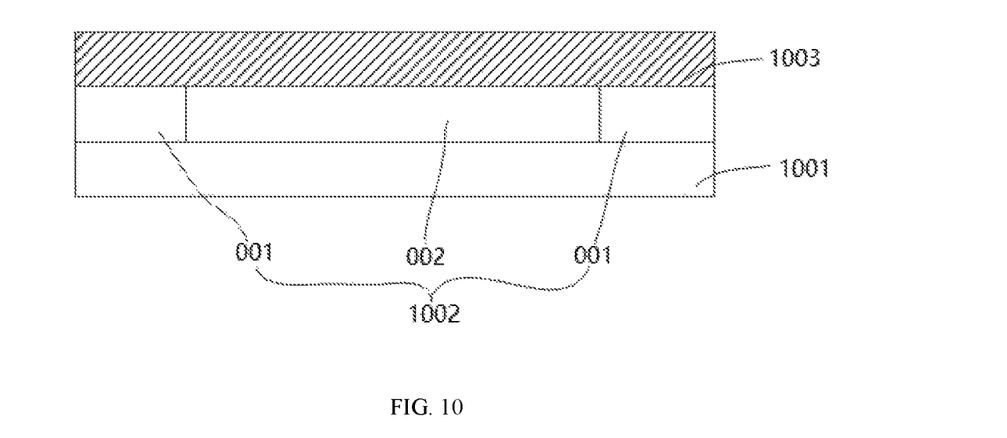
FIG. 10 is a schematic structure diagram illustrating the flexible display module in FIG. 1 including a strain blocking layer disposed between two adjacent module material layers.

FIG. 10 is a schematic structure diagram illustrating the flexible display module in FIG. 1 including a strain blocking layer disposed between two adjacent module material layers.

As shown in FIG. 10, the flexible display module provided by the embodiment of the present invention includes: a first module material layer 1001 and a second module material layer 1003 stacked on the first flexible layer; and at least one strain blocking layer 1002 disposed between the first module material layer 1001 and the second module material layer 1003. The strain blocking layer 1002 includes a chamber 002 and an elastic material layer 001 surrounding the periphery of the chamber 002.

It should be understood that the module material layer is a functional unit constituting the flexible display module, and each module material layer may include a plurality of functional layers. For example, the module material layer may be a functional layer in the first flexible material layer 101, the second flexible material layer 102 or the module layer 104 (e.g., a substrate, a thin film transistor device layer, an organic light emitting diode device layer, a touch screen, a polarizer or the like). In order to distinguish different module material layers, qualifiers, such as first and second, are introduced in the embodiments of the present invention, for example, the first module material layer 1001, the second module material layer 1003 or the like.

In the flexible display module provided by the embodiment of the present invention, a strain blocking layer 1002 is disposed between the first module material layer 1001 and the second module material layer 1003. Since the strain blocking layer 1002 can effectively block the strain of the first module material layer 1001 and the second module material layer 1003, the transfer of the strain between the first module material layer 1001 and the second module material layer 1003 during the bending deformation can be effectively prevented, and the strain of the first module material layer 1001 and the second module material layer 1003 is reduced. Accordingly, the bending resistance of the flexible display module is significantly improved, and the reliability of product is improved.

The flexible display module provided by the embodiment of the present invention is not limited to include only the first module material layer 1001 and the second module material layer 1003 shown in FIG. 1, but the flexible display module may also include more module material layers. Meanwhile, a strain blocking layer 1002 may be disposed between two adjacent module material layers. The number of the module material layers and which adjacent module material layers are provided with the strain blocking layer 1002 are not specifically limited in the embodiments of the present invention.

In an embodiment, the chamber 002 may be filled with a gas or a liquid (e.g., silicone oil), or may be in vacuum, both of which can achieve the strain blocking effect. However, when the chamber 002 is filled with a gas, the pressure inside and outside the chamber 002 can be balanced.

In an embodiment, the gas may be one or a mixture of more of air or inert gases. Air is abundant and convenient to collect. The overall manufacturing cost of the flexible display module can be reduced when the chamber 002 is filled with air. The gas may also be an inert gas. Since the inert gas is stable in chemical properties and difficult to chemically react with a substance in contact therewith, the service life of the flexible display module can be prolonged when the chamber 002 is filled with an inert gas. The type of gas in the chamber 002 is not specifically limited in the embodiments of the present invention.

Figure 11:
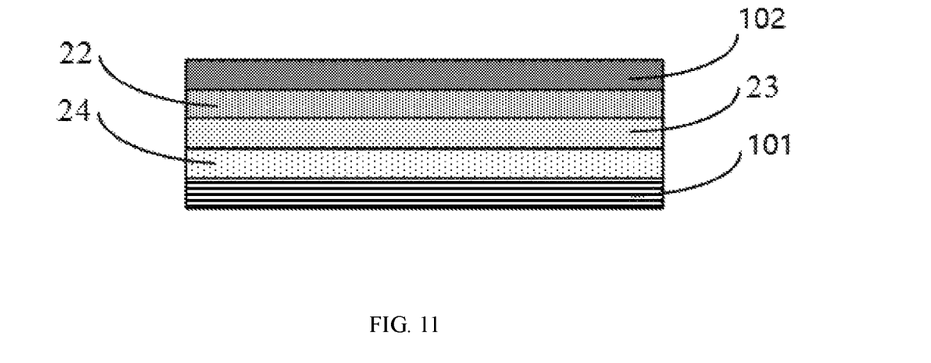
FIG. 11 is a schematic structure diagram illustrating the module layer in FIG. 1 including a polarization layer, a third flexible glass layer, a conductive material layer, and a display functional layer.

FIG. 11 is a schematic structure diagram illustrating the module layer in FIG. 1 including a polarization layer, a third flexible glass layer, a conductive material layer, and a display functional layer. As shown in FIG. 11, the flexible display module includes a second flexible material layer 102, the polarization layer 22, a touch layer 23, the display functional layer 24 and a first flexible material layer 101 which are sequentially stacked from top to bottom. The touch layer 23 includes the third flexible glass layer 33 and the conductive material layer (not shown) coated onto one side of the third flexible glass layer 33. It can be known that the module layer 104, in the embodiment shown in FIG. 11, is a display panel including the polarization layer 22, the third flexible glass layer 33, the conductive material layer and the display functional layer 24. It should be understood that the display functional layer 24 may be either an OLED functional layer or other film layers having a display function.

The specific implementation includes the following two situations.

In the first situation, the conductive material layer in the touch layer 23 is coated onto an upper end surface of the third flexible glass layer 33. In this case, the third flexible glass layer 33 in the touch layer 23 is in direct contact with the display functional layer 24.

The third flexible glass layer 33 and the display functional layer 24 which are in direct contact with each other need to be adhesively fixed by an adhesive layer. In addition, in order to completely avoid the damage to the display functional layer 24 from external substances such as moisture and oxygen, an encapsulation operation needs to be performed on the periphery of the adhesive layer between the third flexible glass layer 33 and the display functional layer 24 to form an encapsulation layer. This encapsulation layer is disposed along the periphery of the adhesive layer that is not in contact with other film layers of the flexible substrate.

In the second situation, the conductive material layer in the touch layer 23 is coated onto a lower end surface of the third flexible glass layer 33. In this case, the conductive material layer coated onto the third flexible glass layer 33 is included between the third flexible glass layer 33 and the display functional layer 24 in the touch layer 23. In addition, in order to achieve firm adhesion, an adhesive layer (not shown) should be included between the third flexible glass layer 33 and the display functional layer 24 in the touch layer 23, that is, the adhesive layer is disposed between the conductive material layer and the display functional layer 24, and an encapsulation operation is performed on the conductive material layer and the adhesive layer to form an encapsulation layer. This encapsulation layer is disposed along the peripheries of the conductive material layer and the adhesive layer that are not contact with other film layers of the flexible substrate to completely avoid the damage to the display functional layer 24 from external substances such as moisture and oxygen.

In the flexible substrate provided by the first embodiment of the present invention, by coating the conductive material onto the third flexible glass layer 33 by a coating process to form a conductive material layer and stacking the third flexible glass layer 33 coated with the conductive material layer on other film layers to form a flexible substrate, the probability of the splitting of film layers during bending is reduced while the thickness of the flexible substrate and the number of film layers are reduced finally.

Figure 12:
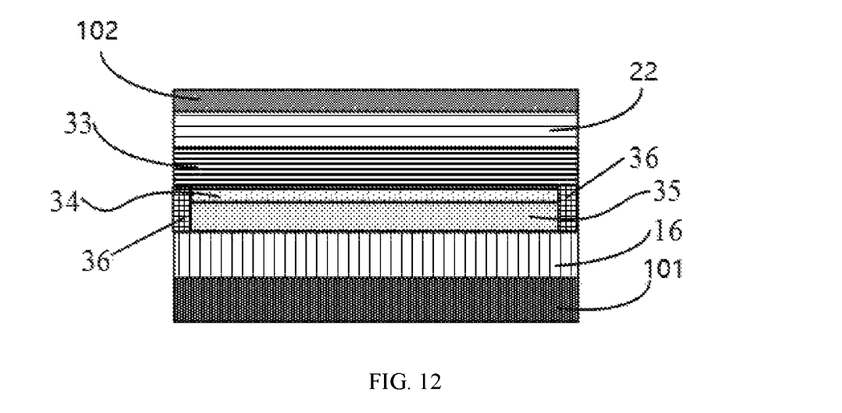
FIG. 12 is a schematic structure diagram illustrating the module layer in FIG. 1 including a polarization layer, an ultra-thin glass layer, an ITO layer, a pressure-sensitive adhesive layer, an OLED layer, and a moisture and oxygen blocking adhesive layer.

FIG. 12 is a schematic structure diagram illustrating the module layer in FIG. 1 including a polarization layer, an ultra-thin glass layer, an ITO layer, a pressure-sensitive adhesive layer, an OLED layer, and a moisture and oxygen blocking adhesive layer. As shown in FIG. 12, the flexible display module provided by the second embodiment of the present invention includes a second flexible material layer 102, the polarization layer 22, the ultra-thin glass layer 33, the ITO (conductive material) layer 34, the pressure-sensitive adhesive layer 35, the OLED layer 16 and a first flexible material layer 101, which are sequentially stacked from top to bottom, as well as moisture and oxygen blocking adhesive layers 36 disposed along peripheries of the ITO layer 34 and the pressure-sensitive adhesive layer 35 that are not in contact with other film layers of the flexible substrate. By providing the moisture and oxygen blocking adhesive layers 36, the damage to the OLED layer 16 from external substances such as moisture and oxygen is completely avoided. In this case, the OLED layer may be the above-mentioned organic light emitting diode device layer.

In addition, in an actual application scenario, when the module layer 104 is a display panel, the module layer 104 needs to be electrically connected to an external circuit structure via conductive leads. The conductive lead electrically connected to the module layer 104 may be formed by punching a hole on a surface (a side surface, an upper surface or a bottom surface) of the flexible glass layer 10, and then filling the hole with a conductive material. A gap between the conductive material in a hole and the hole may be sealed by a sealing material. Or, it is also possible that a conductive thin film extending to the outer surface of the first flexible material layer 101 is firstly plated on a side surface of the groove of the first flexible material layer 101. The thin film is etched to form a pattern of conductive leads, and then the second flexible material layer 102 and the first flexible material layer 101 are encapsulated. The module layer 104 encapsulated into the flexible glass layer 10 may also be electrically connected to the external circuit structure in other ways, and the specific structure and formation method of the conductive leads are not limited in the present invention.

Figure 13:
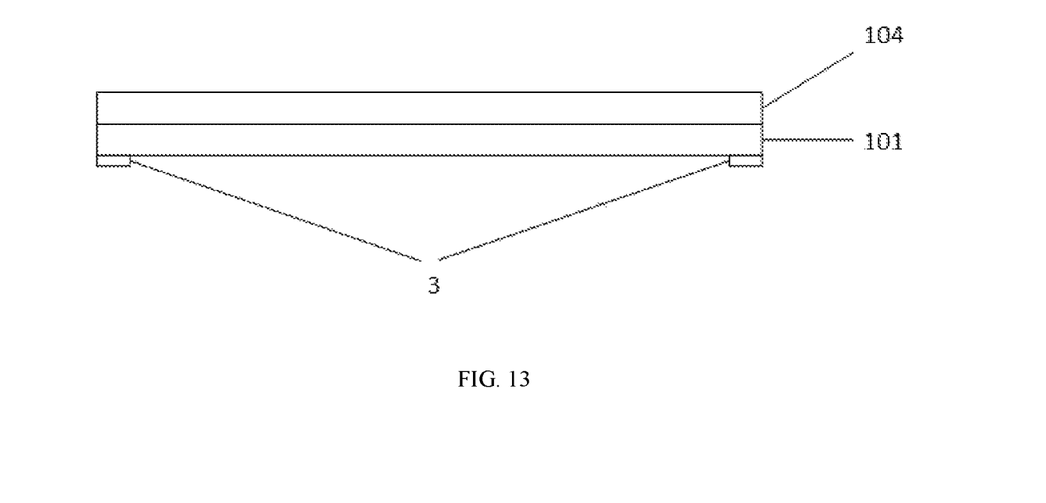
FIG. 13 is a schematic structure diagram illustrating the flexible display module in FIG. 1 including a wiring region.

FIG. 13 is a schematic structure diagram illustrating the flexible display module in FIG. 1 including a wiring region. As shown in FIG. 13, the module layer 104 is also a display panel. Besides the first flexible material layer 101, the second flexible material layer 102 and the module layer 104 disposed on a first surface of the first flexible material layer 101 mentioned in the foregoing embodiment. The flexible display module further includes the wiring region 3 disposed on a second surface of the first flexible material layer 101. The second surface is a surface opposite to the first surface, and the wiring region 3 is electrically connected to the module layer 104 on the first surface.

In this embodiment, the first surface of the first flexible material layer 101 is a front surface on which a TFT (thin film transistor) array layer, an anode layer, an organic light emitting layer, a cathode layer and the like may be sequentially disposed. These functional layers collectively constitute the module layer 104 and become a display region of the display device. The second surface of the first flexible material layer 101 is a rear surface. The wiring region 3 serving as a non-display region is disposed at a corresponding position on the rear surface of the first flexible material layer, for example, a surrounding edge region, so that the area of the non-display region on the front surface of the device is greatly reduced and the device can achieve the narrow-bezel or even bezel-less display effect. In this case, the TFT array layer may be the thin film transistor device layer described above, and the organic light emitting layer may include the organic light emitting diode device layer described above.

In the display device provided by the embodiment, the wiring region serving as the non-display region is disposed on the rear surface of the substrate, so that the wiring region is electrically connected to the OLED module on the front surface to achieve the wiring function, thereby greatly reducing the area of the non-display region on the front surface of the display device, achieving the narrow-bezel or even bezel-less display effect of the device, enhancing the display effect of the screen, and improving the user's visual experience.

In an embodiment of the present invention, the first flexible materials 101 includes vias, and circuit wires in the wiring region 3 may be connected to the module layer 104 on the front surface through the vias in the first flexible material layer 101. Specifically, the vias may be in one-to-one correspondence to the circuit wires, or one via corresponding to multiple circuit wires or one via corresponding to all circuit wires may be disposed. For the formation of the vias, the vias may be punched by a laser or chemically, and the walls of the holes may be vapor-deposited with various conductive media such as copper. In this way, the circuit wires in the wiring region 3 on the rear surface of the first flexible material layer 101 can be electrically connected to the module layer 104 on the front surface through the vias.

In an embodiment of the present invention, when the display screen to be manufactured needs to have a predetermined curved shape (for example, a 2.5D surface with a flat surface in the middle and a curved surface surrounding, or a 3D surface with a curved surface both in the middle and surrounding), a frame having the predetermined curved shape may be manufactured first, and then the flexible display module provided by the embodiment of the present invention is installed into the frame. The perimeter of the frame may be less than the perimeter of the flexible display module. The flexible display module is bendable. When the flexible display module is installed into the frame having a perimeter smaller than that of the flexible display module, the flexible display module is bent from a flat surface to a curved surface.

In an embodiment, installing the flexible display module into the frame may include: attaching the border of the frame to the periphery of the flexible display module. In order to ensure firmer installation of the flexible display module to the frame, an annular groove may be formed on an inner surface of the frame.

The annular groove preferably has a depth of 3-5 mm. In this way, the firm installing can be ensured, and the frame is not too thick. The width of the annular groove may be equal to the thickness of the flexible display module.

The cross-sectional shape of the annular groove may be any one of a U shape, an arc shape and a trapezoidal shape. The depth, width and shape of the annular groove is not strictly limited in the present invention.

Figure 14:
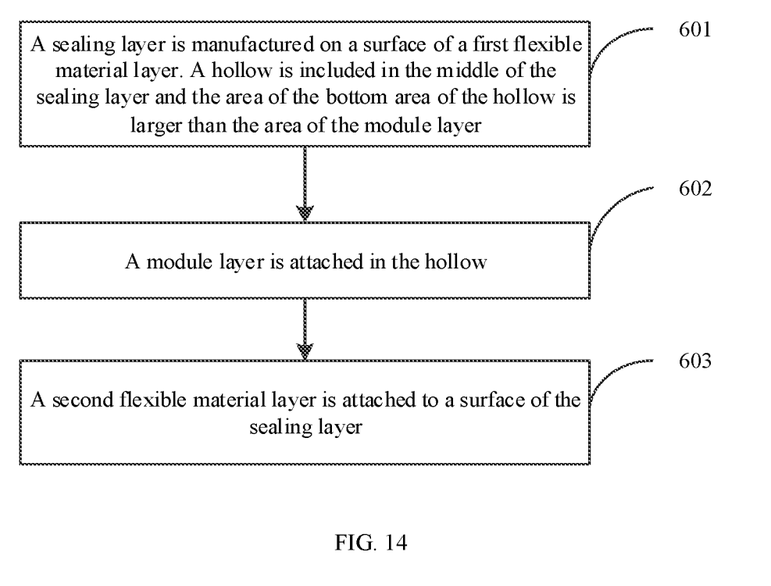
FIG. 14 is a schematic flow chart illustrating a method for manufacturing the flexible display module in FIG. 2.

FIG. 14 is a schematic flow chart illustrating a method for manufacturing the flexible display module in FIG. 2. As shown in FIG. 14, the method for manufacturing the flexible display module includes the following steps.

Step 601: A sealing layer 103 is manufactured on a surface of a first flexible material layer 101. A hollow 1031 is included in the middle of the sealing layer 103 and the area of the bottom area of the hollow 1031 is larger than the area of the module layer 104.

In an embodiment of the present invention, in order to be more flexible and smooth sliding of the subsequently-attached module layer 104 relative to the first flexible material layer 101, a first silicone oil layer may be coated on a bottom surface of the hollow 1031.

Step 602: A module layer 104 is attached in the hollow 1031.

In an embodiment of the present invention, as described above, when the module layer 104 is a display panel, the module layer 104 includes a bonding end 1041 for establishing an electrical connection with an external circuit structure. The sealing layer 3 in the shape of an integral frame cannot meet the requirement for realizing the electrical connection of the module layer 104 with an external structure. In this case, the module layer 104 may be first attached in an open region of an open frame portion 1033, so that the bonding end 1041 of the module layer 104 extends out from the open region of the open frame portion 1033. Then, a rim portion 1032 of the sealing layer 3 is pressed onto a surface of the bonding end 1041 of the module layer 104, and bonding pins of the bonding end 1041 are exposed. The open frame portion 1033 and the rim portion 1032 are combined to form the frame shape.

In an embodiment of the present invention, a sealing material layer may be manufactured on a surface of the first flexible material layer 101, and then the open frame portion 1033 is formed by cutting the sealing material layer by laser etching. The specific manufacture method of the open frame portion 1033 of the sealing layer 103 is not strictly limited in the present invention.

Step 603: A second flexible material layer 102 is attached to a surface of the sealing layer 103.

In an embodiment of the present invention, in order to realize more flexible and smooth sliding of the module layer 104 relative to the second flexible material layer 102, a second silicone oil layer may be coated on the surface of the module layer 104.

In an embodiment of the present invention, the module layer 104 includes a fixed region where the module layer is fixed to the first flexible material layer 101 and/or the second flexible material layer 102, and the fixed region extends from the bonding end 1041. In this case, the module layer 104 may be fixed to the first flexible material layer 101 and/or the second flexible material layer 102 by an adhesive material (e.g., OCA) in the fixed region.

In an embodiment of the present invention, the sealing layer 103 may be adhered to the first flexible material layer 101 and/or the second flexible material layer 102 by an adhesive layer (e.g., OCA). The material of the used adhesive layer is not limited in the present invention.

In an embodiment of the present invention, the sealing layer 103 includes at least one gas vent 1034, and the gas vent 1034 may be formed by laser etching. In this case, the second flexible material layer 102 may be attached to the surface of the sealing layer 103 along a direction at which the at least one gas vent 1034 extends outwardly, so that bubbles generated during the process of attaching the second flexible material layer 102 to the surface of the sealing layer 103 are discharged. Subsequently, the at least one gas vent is sealed by a sealing material. The specific disposed location, location combination and number of the at least one gas vent 1034 as well as the material forming the sealing material is not limited in the present invention.

Figure 15:
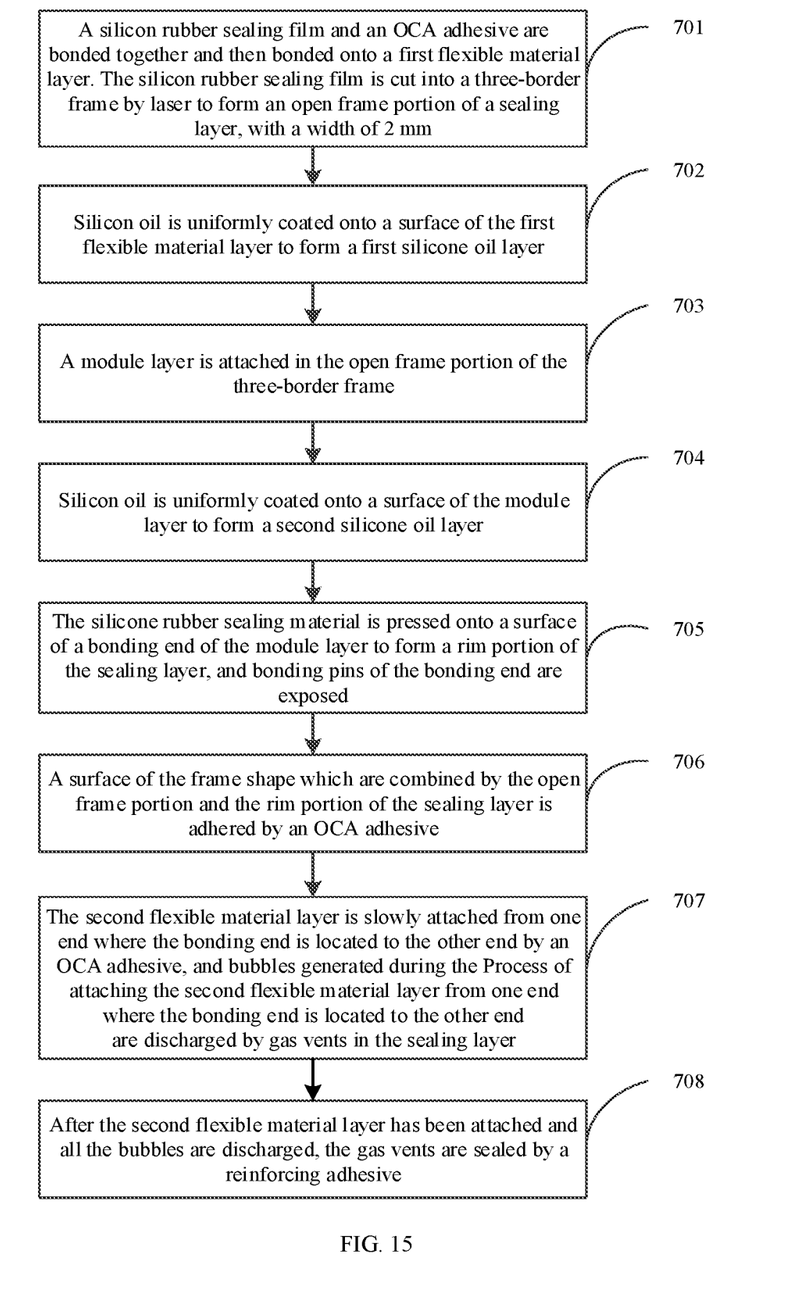
FIG. 15 is a schematic flow chart illustrating a method for manufacturing the flexible display module in FIG. 4, FIG. 5 or FIG. 6.

FIG. 15 is a schematic flow chart illustrating a method for manufacturing the flexible display module in FIG. 4, FIG. 5 or FIG. 6. As shown in FIG. 15, the method for manufacturing the flexible display module may include the following steps.

Step 701: A silicon rubber sealing film and an OCA adhesive are bonded together and then bonded onto a first flexible material layer 101. The silicon rubber sealing film is cut into a three-border frame by laser to form an open frame portion of a sealing layer 103, with a width of 2 mm.

Step 702: Silicon oil is uniformly coated onto a surface of the first flexible material layer 101 to form a first silicone oil layer.

Step 703: A module layer 104 is attached in the open frame portion 1032 of the three-border frame.

Step 704: Silicon oil is uniformly coated onto a surface of the module layer 104 to form a second silicone oil layer. In this case, it should be noted that the silicone oil cannot be coated onto the silicone rubber sealing material of the open frame portion 1032, otherwise the viscosity of the OCA adhesive used in the subsequent step 705 will be affected.

Step 705: The silicone rubber sealing material is pressed onto a surface of a bonding end 1041 of the module layer 104 to form a rim portion 1032 of the sealing layer 103, and bonding pins of the bonding end 1041 are exposed.

Step 706: A surface of the frame shape which are combined by the open frame portion 1033 and the rim portion 1032 of the sealing layer 103 is adhered by an OCA adhesive.

Step 707: The second flexible material layer 102 is slowly attached from one end where the bonding end 1041 is located to the other end by an OCA adhesive, and bubbles generated during the process of attaching the second flexible material layer 102 from one end where the bonding end 1041 is located to the other end are discharged by gas vents 1034 in the sealing layer 103.

Step 708: After the second flexible material layer 102 has been attached and all the bubbles are discharged, the gas vents 1034 are sealed by a reinforcing adhesive. In this way, a flexible display module using two flexible glass layers instead of the conventional PET film (high-temperature polyester film) as a cover plate is replaced.

In an embodiment of the present invention, the first flexible material layer 101 and/or the second flexible material layer 102 may be a flexible glass layer. By replacing a substrate and/or a cover plate in the existing flexible display module by the flexible glass layer, the conflict between the stiffness and the prevention of splitting of film layers in the existing flexible display module can be effectively solved due to the excellent stiffness and bending resistance of the flexible glass itself. Meanwhile, since the module layer 104 is disposed in a hollow 1031 between the first flexible material layer 101 and the second flexible material layer 102 and the area of the bottom area of the hollow 1031 is larger than the area of the module layer 104. When the flexible module 104 is bent, the module layer 104 can slide in the hollow 1031 relative to the first flexible material layer 101 and the second flexible material layer 102, so that the bending stress is relieved. Accordingly, the splitting of film layers inside the module layer 104 can be effectively prevented, the bending resistance of the flexible display modules is further improved, and the reliability of product is improved.

The foregoing description merely shows the preferred embodiments of the present invention and is not intended to limit the protection scope of the present invention. Any modifications, equivalent replacements and improvements made within the spirit and principle of the present invention shall fall into the protection scope of the present invention.

What is claimed is:

1. A flexible display module, comprising:
 a first flexible material layer and a second flexible material layer stacked on the first flexible layer;
 a sealing layer disposed between the first flexible material layer and the second flexible material layer, the sealing layer having a hollow defined in a middle thereof, the sealing layer comprising a rim portion and an open frame portion, the open frame portion and the rim portion being combined to form a frame shape and
 a module layer disposed in the hollow of the sealing layer, wherein an area of a bottom area of the hollow is larger than an area of the module layer, the module layer being a display panel comprising a bonding end for establishing an electrical connection with an external circuit structure, the rim portion of the sealing layer being pressed onto a surface of the bonding end of the module layer, and bonding pins of the bonding end being exposed.

2. The flexible display module according to claim 1, wherein the first flexible material layer and/or the second flexible material layer is a flexible glass layer.

3. The flexible display module according to claim 1, further comprising:
 a first silicone oil layer disposed between the module layer and the first flexible material layer; and/or
 a second silicone oil layer disposed between the module layer and the second flexible material layer.

4. The flexible display module according to claim 1, wherein the module layer comprises a fixed region fixed to the first flexible material layer and/or the second flexible material layer, and a sliding region slidable relative to the first flexible material layer and the second flexible material layer in the hollow, the fixed region extending from the bonding end.

5. The flexible display module according to claim 1, wherein the sealing layer comprises at least one gas vent and a sealing material for sealing the gas vent.

6. The flexible display module according to claim 5, wherein the sealing layer comprises a plurality of the gas vents, and the plurality of the gas vents are formed in a predetermined bending region of the flexible display module and/or in an extension region of a gap between the module layer and the hollow, respectively.

7. The flexible display module according to claim 1, wherein the sealing layer is adhered to the first flexible material layer and/or the second flexible material layer by an adhesive layer, and the sealing layer is made of silicone rubber.

8. The flexible display module according to claim 1, wherein the module layer comprises a substrate, a thin film transistor device layer, an organic light emitting diode device layer, a touch screen and a polarizer which are stacked in sequence;
 or, the module layer is one or a combination of the substrate, the thin film transistor device layer, the organic light emitting diode device layer, the touch screen and the polarizer;
 or, the module layer comprises a polarization layer, a touch layer and a display functional layer which are stacked, wherein the touch layer comprises a third flexible glass layer and a conductive material layer coated onto one side of the third flexible glass layer, and the conductive material layer is disposed between the third flexible glass layer and the display functional layer;

or, the module layer comprises the polarization layer, an ultra-thin glass layer, an indium tin oxide layer, a pressure-sensitive adhesive layer and the organic light emitting diode device layer which are stacked, wherein only the indium tin oxide layer and the pressure-sensitive adhesive layer have moisture and oxygen blocking adhesive layers disposed on peripheries thereof;

or, the module layer comprises the thin film transistor device layer, an anode layer, an organic light emitting layer and a cathode layer which are disposed successively.

9. A method for manufacturing a flexible display module according to claim 1, comprising:
  manufacturing the sealing layer on a surface of a first flexible material layer, wherein the sealing layer has a hollow defined in a middle thereof, and an area of a bottom area of the hollow is larger than an area of the module layer;
  attaching the module layer within the hollow; and
  attaching the second flexible material layer to a surface of the sealing layer,
  wherein before the attaching the module layer within the hollow, the method comprises coating a first silicone oil layer on a bottom surface of the hollow.

10. The method for manufacturing a flexible display module according to claim 9,
  before the attaching a second flexible material layer to a surface of the sealing layer, further comprising:
  coating a second silicone layer on a surface of the module layer.

11. The method for manufacturing a flexible display module according to claim 9, wherein the module layer is a display panel comprising a bonding end for establishing an electrical connection with an external circuit structure;
  wherein the manufacturing a sealing layer on a surface of a first flexible material layer comprises: manufacturing, on a surface of the first flexible material layer, an open frame portion of the sealing layer;
  wherein the attaching the module layer within the hollow comprises: attaching the module layer within an open region of the open frame portion, and making the bonding end of the module layer extending out from the open region of the open frame portion;
  wherein, before the attaching a second flexible material layer to a surface of the sealing layer, the method further comprises: pressing a rim portion of the sealing layer onto a surface of the bonding end of the module layer and exposing bonding pins of the bonding end; and
  wherein the open frame portion and the rim portion are combined to form a frame shape.

12. The method for manufacturing a flexible display module according to claim 11, wherein the module layer comprises a fixed region where the module layer is fixed to the first flexible material layer and/or the second flexible material layer, wherein the fixed region extends from the bonding end;
  wherein the method further comprises:
  fixing the module layer to the first flexible material layer and/or the second flexible material layer by an adhesive material in the fixed region.

13. The method for manufacturing a flexible display module according to claim 11, wherein the manufacturing, on a surface of the first flexible material layer, an open frame portion of the sealing layer comprises:
  manufacturing a sealing material layer on the surface of the first flexible material layer; and
  forming the open frame portion by cutting the sealing material layer by laser etching.

14. The method for manufacturing a flexible display module according to claim 9, wherein the sealing layer is adhered to the first flexible material layer and/or the second flexible material layer by an adhesive layer.

15. The method for manufacturing a flexible display module according to claim 9, wherein the sealing layer comprises at least one gas vent;
  wherein the attaching a second flexible material layer to a surface of the sealing layer comprises:
  attaching the second flexible material layer to the surface of the sealing layer along a direction at which the at least one gas vent extends outwardly; and
  sealing the at least one gas vent by a sealing material.

16. A flexible display module, comprising:
  a first flexible material layer comprising a groove;
  a module layer disposed in the groove of the first flexible material layer; and
  a second flexible material layer disposed on the module layer;
  wherein the module layer is adhered within the groove of the first flexible material layer by an optical adhesive or attached by silicone oil, and a cross-sectional area of the groove is larger than a cross-sectional area of the module layer.

17. The flexible display module according to claim 16, wherein a periphery of the second flexible material layer and a side of the groove of the first flexible material layer are encapsulated by a laser-sintering glass frit process.

18. The flexible display module according to claim 16, wherein the second flexible material layer is adhered onto the module layer by an optical adhesive.

19. A flexible display module, comprising:
  a first flexible material layer and a second flexible material layer stacked on the first flexible layer;
  a sealing layer disposed between the first flexible material layer and the second flexible material layer, the sealing layer having a hollow defined in a middle thereof; and
  a module layer disposed in the hollow of the sealing layer, wherein an area of a bottom area of the hollow is larger than an area of the module layer,
  a first silicone oil layer disposed between the module layer and the first flexible material layer.

20. The flexible display module according to claim 19, further comprising:
  a second silicone oil layer disposed between the module layer and the second flexible material layer.

* * * * *